US00RE43955E

(19) United States
(12) Reissued Patent
Shkolnik et al.

(10) Patent Number: US RE43,955 E
(45) Date of Reissued Patent: Feb. 5, 2013

(54) PROCESS FOR THE PRODUCTION OF A THREE-DIMENSIONAL OBJECT WITH RESOLUTION IMPROVEMENT BY PIXEL-SHIFT

(75) Inventors: Alexandr Shkolnik, Los Angeles, CA (US); Hendrik John, Hunxe (DE); Ali El-Sibiani, Dearborn Heights, MI (US)

(73) Assignee: Envisiontec GmbH, Gladbeck (DE)

(21) Appl. No.: 13/230,270

(22) Filed: Sep. 12, 2011

Related U.S. Patent Documents

Reissue of:
(64) Patent No.: 7,790,093
Issued: Sep. 7, 2010
Appl. No.: 11/126,068
Filed: May 9, 2005

U.S. Applications:
(60) Provisional application No. 60/569,893, filed on May 10, 2004.

(30) Foreign Application Priority Data

May 10, 2004 (DE) ..... 10 2004 022 961

(51) Int. Cl.
*G02F 1/00* (2006.01)
(52) U.S. Cl. ..... 264/401; 700/120; 264/497
(58) Field of Classification Search ..... 264/401, 264/497; 700/120
See application file for complete search history.

(56) References Cited

U.S. PATENT DOCUMENTS 4,575,330 A 3/1986 Hull
4,837,379 A 6/1989 Weinberg
4,929,402 A 5/1990 Hull
4,999,143 A 3/1991 Hull et al.
5,093,130 A 3/1992 Fujii et al.
5,137,662 A 8/1992 Hull et al.
5,143,663 A 9/1992 Leyden et al.
5,173,266 A 12/1992 Kenney
5,174,931 A 12/1992 Almquist et al.
5,236,637 A 8/1993 Hull (Continued)

FOREIGN PATENT DOCUMENTS

DE 4105314 A1 8/1991
DE 4102257 A1 7/1992

(Continued)

OTHER PUBLICATIONS

Opposition to EP 1,849,587, dated Apr. 8, 2010.

(Continued)

*Primary Examiner* — Joseph Del Sole
*Assistant Examiner* — Kimberly A Stewart
(74) *Attorney, Agent, or Firm* — Hansen IP Law PLLC

(57) ABSTRACT

The invention relates to a process or a device for the production of a three-dimensional object by layer-wise solidification of a material which is solidifiable under the application of electromagnetic irradiation by means of mask illumination, wherein the mask is produced using an image forming unit having a prescribed resolution, which is formed from a constant number of image forming elements (pixels) being discrete and being arranged in a spatially mutually fixed manner. For the improvement of the resolution along the outer and inner contours of the sectional areas of the object to be generated layer-wise in the sub-pixel range, a multiple illumination per layer is performed, which consists of a series of multiple images that are mutually shifted in the sub-pixel range in the image/construction plane, wherein a separate mask/bitmap is produced for each shifted image.

24 Claims, 7 Drawing Sheets

U.S. PATENT DOCUMENTS

| | | | |
|---|---|---|---|
| 5,247,180 | A | 9/1993 | Mitcham et al. |
| 5,248,456 | A | 9/1993 | Evans, Jr. et al. |
| 5,254,979 | A | 10/1993 | Trevett et al. |
| 5,263,130 | A | 11/1993 | Pomerantz et al. |
| 5,268,994 | A | 12/1993 | Keskes |
| 5,298,208 | A | 3/1994 | Sibley et al. |
| 5,306,446 | A | 4/1994 | Howe |
| 5,345,391 | A | 9/1994 | Hull et al. |
| 5,360,981 | A | 11/1994 | Owen et al. |
| 5,391,072 | A | 2/1995 | Lawton et al. |
| 5,437,820 | A | 8/1995 | Brotz |
| 5,447,822 | A | 9/1995 | Hull et al. |
| 5,510,077 | A | 4/1996 | Dinh et al. |
| 5,529,473 | A | 6/1996 | Lawton et al. |
| 5,545,367 | A | 8/1996 | Bae et al. |
| 5,569,431 | A | 10/1996 | Hull |
| 5,571,471 | A | 11/1996 | Hull |
| 5,630,981 | A | 5/1997 | Hull |
| 5,651,934 | A | 7/1997 | Almquist et al. |
| 5,653,925 | A | 8/1997 | Batchelder |
| 5,823,778 | A | 10/1998 | Schmitt et al. |
| 5,858,746 | A | 1/1999 | Hubbell et al. |
| 5,891,382 | A | 4/1999 | Almquist et al. |
| 5,894,036 | A | 4/1999 | Tylko |
| 5,897,825 | A | 4/1999 | Fruth et al. |
| 5,902,537 | A | 5/1999 | Almquist et al. |
| 5,943,235 | A | 8/1999 | Earl et al. |
| 5,980,813 | A | 11/1999 | Narang et al. |
| 6,013,099 | A | 1/2000 | Dinh et al. |
| 6,027,324 | A | 2/2000 | Hull |
| 6,048,487 | A | 4/2000 | Almquist et al. |
| 6,051,179 | A | 4/2000 | Hagenau |
| 6,078,038 | A | 6/2000 | Cooper |
| 6,124,858 | A | 9/2000 | Ge et al. |
| 6,158,946 | A | 12/2000 | Miyashita |
| 6,171,610 | B1 | 1/2001 | Vacanti et al. |
| 6,180,050 | B1 | 1/2001 | Arai et al. |
| 6,280,727 | B1 | 8/2001 | Prior et al. |
| 6,334,865 | B1 | 1/2002 | Redmond et al. |
| 6,352,710 | B2 | 3/2002 | Sawhney et al. |
| 6,391,245 | B1 | 5/2002 | Smith |
| 6,500,378 | B1 | 12/2002 | Smith |
| 6,501,483 | B1 | 12/2002 | Wong et al. |
| 6,508,971 | B2 | 1/2003 | Leyden et al. |
| 6,547,552 | B1 | 4/2003 | Fudim |
| 6,600,965 | B1 | 7/2003 | Hull et al. |
| 6,630,009 | B2 | 10/2003 | Moussa et al. |
| 6,764,636 | B1 | 7/2004 | Allanic et al. |
| 6,833,231 | B2 | 12/2004 | Moussa et al. |
| 6,833,234 | B1 | 12/2004 | Bloomstein et al. |
| 6,942,830 | B2 | 9/2005 | Mulhaupt et al. |
| 6,963,319 | B2 | 11/2005 | Pate et al. |
| 6,974,656 | B2 | 12/2005 | Hinczewski |
| 6,989,225 | B2 | 1/2006 | Steinmann |
| 7,034,811 | B2 | 4/2006 | Allen |
| 7,052,263 | B2 | 5/2006 | John |
| 7,128,866 | B1 | 10/2006 | Henningsen |
| 7,195,472 | B2 | 3/2007 | John |
| 7,403,213 | B1 | 7/2008 | Morgan et al. |
| 7,467,939 | B2 | 12/2008 | Sperry et al. |
| 7,758,799 | B2 | 7/2010 | Hull et al. |
| 7,790,093 | B2 | 9/2010 | Shkolnik et al. |
| 2001/0028495 | A1 | 10/2001 | Quate et al. |
| 2001/0048183 | A1 | 12/2001 | Fujita |
| 2002/0028854 | A1 | 3/2002 | Allanic et al. |
| 2002/0155189 | A1 | 10/2002 | John |
| 2003/0074096 | A1 | 4/2003 | Das et al. |
| 2003/0173714 | A1 | 9/2003 | Ueno |
| 2003/0205849 | A1 | 11/2003 | Farnworth |
| 2004/0008309 | A1 | 1/2004 | Yamahara et al. |
| 2004/0027363 | A1 | 2/2004 | Allen |
| 2004/0028293 | A1 | 2/2004 | Allen et al. |
| 2005/0023710 | A1 | 2/2005 | Brodkin et al. |
| 2005/0208168 | A1 | 9/2005 | Hickerson et al. |
| 2005/0248061 | A1 | 11/2005 | Shkolnik et al. |
| 2005/0248062 | A1 | 11/2005 | Shkolnik et al. |
| 2005/0259785 | A1 | 11/2005 | Zhang |
| 2005/0288813 | A1 | 12/2005 | Yang et al. |
| 2006/0078638 | A1 | 4/2006 | Holmboe et al. |
| 2006/0192312 | A1 | 8/2006 | Wahlstrom |
| 2006/0239588 | A1 | 10/2006 | Hull et al. |
| 2006/0249884 | A1 | 11/2006 | Partanen et al. |
| 2007/0074659 | A1 | 4/2007 | Wahlstrom |
| 2007/0075458 | A1 | 4/2007 | Wahlstrom et al. |
| 2007/0075459 | A1 | 4/2007 | Reynolds et al. |
| 2007/0075460 | A1 | 4/2007 | Wahlstrom et al. |
| 2007/0075461 | A1 | 4/2007 | Hunter et al. |
| 2007/0077323 | A1 | 4/2007 | Stonesmith et al. |
| 2007/0257055 | A1 | 11/2007 | Scott et al. |
| 2007/0259066 | A1 | 11/2007 | Sperry et al. |
| 2008/0038396 | A1 | 2/2008 | John et al. |
| 2008/0054531 | A1 | 3/2008 | Kerekes et al. |
| 2008/0169586 | A1 | 7/2008 | Hull et al. |
| 2008/0169589 | A1 | 7/2008 | Sperry et al. |
| 2008/0170112 | A1 | 7/2008 | Hull et al. |
| 2008/0179786 | A1 | 7/2008 | Sperry et al. |
| 2008/0179787 | A1 | 7/2008 | Sperry et al. |
| 2008/0181977 | A1 | 7/2008 | Sperry et al. |
| 2008/0206383 | A1 | 8/2008 | Hull et al. |
| 2008/0217818 | A1 | 9/2008 | Holmboe et al. |
| 2008/0226346 | A1 | 9/2008 | Hull et al. |
| 2008/0231731 | A1 | 9/2008 | Hull et al. |
| 2008/0309665 | A1 | 12/2008 | Gregory, II et al. |

FOREIGN PATENT DOCUMENTS

| | | | | |
|---|---|---|---|---|
| DE | 4125534 | A1 | | 2/1993 |
| DE | 93 19 405.6 | | | 5/1994 |
| DE | 9319405.6 | U1 | | 5/1994 |
| DE | 4340108 | C2 | | 9/1997 |
| DE | 197 16 240 | A1 | | 10/1998 |
| DE | 19716240 | A1 | | 10/1998 |
| DE | 197 27 554 | | | 1/1999 |
| DE | 19727554 | A1 | | 1/1999 |
| DE | 299 11 122 | U1 | | 11/1999 |
| DE | 29911122 | U1 | | 11/1999 |
| DE | 19838797 | A1 | | 3/2000 |
| DE | 199 29 199 | A1 | | 1/2001 |
| DE | 19929199 | A1 | | 1/2001 |
| DE | 19929199 | | * | 2/2001 |
| DE | 10003374 | C1 | | 8/2001 |
| DE | 100 18 987 | | | 10/2001 |
| DE | 10018987 | A1 | | 10/2001 |
| DE | 20106887 | U1 | | 10/2001 |
| DE | 69909136 | T2 | | 5/2004 |
| DE | 102004022961 | A1 | | 12/2005 |
| EP | 0 250 121 | | | 12/1987 |
| EP | 0250121 | A2 | | 12/1987 |
| EP | 0426363 | A2 | | 5/1991 |
| EP | 0 435 564 | A2 | | 7/1991 |
| EP | 0435564 | A2 | | 7/1991 |
| EP | 0 466 422 | A1 | | 1/1992 |
| EP | 0466422 | A1 | | 1/1992 |
| EP | 0 484 086 | A1 | | 5/1992 |
| EP | 0484086 | A1 | | 5/1992 |
| EP | 0 958 912 | A1 | | 11/1999 |
| EP | 0958912 | A1 | | 11/1999 |
| EP | 1 250 997 | A1 | | 10/2002 |
| EP | 1250997 | A1 | | 10/2002 |
| EP | 1 270 185 | | | 1/2003 |
| EP | 1270185 | A1 | | 1/2003 |
| EP | 1 192 041 | B1 | | 3/2003 |
| EP | 1192041 | B1 | | 3/2003 |
| EP | 1 156 922 | B1 | | 6/2003 |
| EP | 1156922 | B1 | | 6/2003 |
| EP | 1674243 | A2 | | 6/2006 |
| EP | 1 849 587 | | | 10/2007 |
| EP | 1849587 | A1 | | 10/2007 |
| EP | 1 880 830 | | | 1/2008 |
| EP | 1880830 | A1 | | 1/2008 |
| EP | 1 894 704 | | | 3/2008 |
| EP | 1894704 | A1 | | 3/2008 |
| EP | 1 950 032 | | | 7/2008 |
| EP | 1950032 | A2 | | 7/2008 |
| EP | 2 011 631 | | | 1/2009 |
| EP | 2011631 | A1 | | 1/2009 |
| FR | 2254194 | A5 | | 7/1975 |
| FR | 2583334 | A1 | | 12/1986 |

| | | | |
|---|---|---|---|
| FR | 2 692 053 | | 12/1993 |
| FR | 2692053 | A1 | 12/1993 |
| JP | 04371829 | | 12/1992 |
| JP | 04371829 | A | 12/1992 |
| JP | 08192469 | | 7/1996 |
| JP | 08192469 | A | 7/1996 |
| WF | WO 95/11007 | | 4/1995 |
| WO | 9511007 | A1 | 4/1995 |
| WO | 9515841 | A1 | 6/1995 |
| WO | WO-95/15841 | | 6/1995 |
| WO | 9600422 | A1 | 1/1996 |
| WO | WO-96/00422 | | 1/1996 |
| WO | 0021735 | A1 | 4/2000 |
| WO | WO 00/21735 | | 4/2000 |
| WO | 01/00390 | A1 | 1/2001 |
| WO | 0112679 | A1 | 2/2001 |
| WO | WO-01/12679 | | 2/2001 |
| WO | 0172501 | A1 | 10/2001 |
| WO | WO-01/72501 | A1 | 10/2001 |
| WO | 0227408 | A2 | 4/2002 |
| WO | WO 02/27408 | A2 | 4/2002 |
| WO | 03059184 | A2 | 7/2003 |
| WO | WO-03/059184 | | 7/2003 |

OTHER PUBLICATIONS

C. Sun, et al., "Projection Micro-Stereolithography Using Digital Micro-Mirror Dynamic mask," Sensors and Actuators A 121 (2005) 113-120.
S. Ventura, et al., "Freeform Fabrication of Functional Silicon Nitride Components by Direct Photoshaping," Mat Res. Sol. Symp. Proc., vol. 625 (2000).
K. Takahashi, "A New Application of DMD to Photolithography and Rapid Prototyping System," Institute of Electronics, Information, and Communication Engineers.
Wohlers Report 2000. "Rapid Prototyping & Tooling State of the Industry Annual Worldwide Progress Report", T. Wohlers, Wohlers Association, Inc., Fort Collins, Colorado (2000).
Stark, G.B., et al., "Biological Matrices and Tissue Reconstruction," Springer Publications, Berlin (1998).
Sachs, E., et al., "Three Dimensional Printing: Rapid Tooling and Prototypes Directly from CAD Model," Journal of Engineering for Industry, 114:481-488 (1992).
Kuhtreiber, W., Ph.D., et al., "Cell Encapsulation Technology and Therapeutics," Birkhauser, Boston (1998).
Landers, R., and Mulhaupt, R., "Desktop Manufacturing of Complex Objects, Prototypes and Biomedical Scaffolds by means of Computer-Assisted Design Combined with Computer-Guided 3D Plotting of Polymers and Reactive Oligomers," Macromolecular Materials and Engineering, 282:17-22 (2000).
Okada, T., and Ikada, Y., "Tissue Reactions to Subcutaneously Implanted, Surface-Modified Silicones," Journal of Biomedical Materials Research, 27:1509-1518 (1993).
Relou, I.A., et al., "Effect of Culture Conditions on Endothelial Cell Growth and Responsiveness," Tissue & Cell, 30(5):525-538 (1998).
Nikolaychik, V.V., et al., A New, Cryoprecipitate Based Coating for Improved Endothelial Cell Attachment and Growth on Medical Grade Artificial Surfaces:, ASAIO Journal, 40:M846-M852 (1994).
Burns, "Automatic Fabrication Improving Productivity in Manufacturing", 1993 (ISBN 0-13-119462-3).
IEEE Super Resolution article abstract vol. 20, issue 3, pp. 21-36, May 2003.
37 CFR 1.99 Submission and declaration.
http:/www.hp.com/hpinfo/newsroom/press/2004/040609a.html
"HP technology doubles the resolution of digital projection displays" Jun. 9, 2004.
4 W. Allen, R. Ulichney "Wobulation: Doubling the Addressed Resolution," SID 05 Digest, 2005.
Wobulation, saved as PDF from the internet; wikipedia definition, citing several resolution-relate patents.
*3D Systems, Inc.* v. *Envisiontec, Inc., et al.* Special Masters Report and Recommendation on the Parties' Summary Judgement Motions.
International Search Report (German Translation) for PCT/EP2005/005003, dated Oct. 5, 2004.
International Preliminary Report on Patentability for PCT/EP2008/009041, dated Apr. 27, 2010.
Written Opinion of the International Searching Authority for PCT/EP2008/009041, dated Apr. 27, 2007.
International Search Report for PCT/EP2008/009040, dated Feb. 4, 2009.
Written Opinion of the International Searching Authority for PCT/EP2008/009040, dated Feb. 4, 2009.

* cited by examiner

PROCESS FOR THE PRODUCTION OF A THREE-DIMENSIONAL OBJECT WITH RESOLUTION IMPROVEMENT BY PIXEL-SHIFT

Matter enclosed in heavy brackets [ ] appears in the original patent but forms no part of this reissue specification; matter printed in italics indicates the additions made by reissue.

*CROSS-REFERENCE TO RELATED APPLICATIONS*

*This application claims the benefit of U.S. Provisional Patent Application No. 60/569,893, filed on May 10, 2004.*

TECHNICAL FIELD

The invention related to a process and a device for the production of a three-dimensional object by layer-wise solidification of a photohardening material by mask illumination by means of a rastered image forming unit having constant resolution, wherein the resolution within the image/construction plane shall be improved in the sub-pixel range.

BACKGROUND ART

For the layer-wise construction of three-dimensional objects from "light hardening" materials, various processes are mentioned in literature, see in this respect "Automated Fabrication-Improving Productivity in Manufacturing" of Marshall Burns, 1993 (ISBN 0-13-119462-3).

This invention relates to processes wherein the layer to be generated is based on illumination by means of a rastered mask, wherein the smallest physical resolution within the mask is provided by the size of a pixel.

Known possibilities presently are, inter alia, illumination by a) Projection unit (on the basis of DLP®/DMD®, LCD, ILA®, etc.)
b) LD-display (reflective, transmissive)
c) LED-, or laser-diode-line/-matrix (which is moved in XY-plane over the layer)
d) Line or matrix (which is moved in XY-plane over the layer) based on MEM-technology (light-valve).

Some of these methods are described in the following patents:

IPC: B29C67/00 "Rapid Prototyping apparatus and method of Rapid Prototyping" of Dicon AS (DK), (application)

US patent US005247180 A "Stereolithographic Apparatus and Method of use" of Texas Instruments Inc., September 1993.

US patent US005980813 A "Rapid Prototyping using multiple materials" of SRI International, November 1999;

Utility Model DE G 93 19 405.6 "Device for the production of a three-dimensional object (model) according to the principle of photosolidification" of Research Center Informatik at the University Karlsruhe, Dez. 1993;

An application for the generation of micro-technical, three-dimensional construction parts according to a similar process is described in the Utility Model DE 299 11 122 U1 "Device for the production of a three-dimensional object" DeltaMed et al., June 1999.

PCT Application 02 008 019.8 "Device for the production of a three-dimensional object" of Envision Technologies GmbH, April 2002.

U.S. Pat. No. 6,180,050 describes a linear scan technique for layer-wise solidification in the production of three-dimensional objects. The resolution is enhanced by scanning, in X-direction, an illumination head having an array of optical fibers, which are displaced in the Y-direction.

DRAWBACKS OF THE PRIOR ART

With all of the above described processes, the resolution of the material layer to be hardened is in direct dependency from the resolution of an image forming process.

With the projection processes, an intermediary positioned optic additionally determines the scale of the projected or solidifiable layer.

The resolution per area unit in the image/construction plane thus is dependent on a) the resolution of the image forming unit or the smallest element, called pixel, and their relative mutual distances, called pixel-pitch, and b) the projection scale.

The surface roughness of the construction part thus is determined by the smallest volume unit of one voxel (volume-pixel), the size of which is composed of the projected pixel area in XY and the layer thickness in Z. The resolution of the layer thickness is prescribed by the smallest resolution (step level) of the actuator in Z, in order to move the support platform. Resolutions already down to the one-figure μm range is achievable hereby. If an even lower surface roughness of the construction part shall be realized, the projection field and concurrently the width of the pixel area must be down-sized.

As an example, the projection m.H. of a multi-media projector shall be mentioned here; with a resolution of XGA (1024×768 image dots), a pixel of 17 μm and pixel-pitch of 17.9 μm, one realizes, at a projection to 275 mm×206 mm with an enhancement factor of the projection optic of 15, a resolution in the image/construction plane and thus in the layer to be solidified of approximately 100 dpi, which corresponds to a pixel size in the projection plane of about 0.254 mm×0.254 mm.

In order to e.g. double the resolution in the image-/construction plane, while maintaining the same construction area, it is proposed in the projection processes to half the projection/enhancement factor (which means to quarter the area) and, for the illumination of the four partial planes, to shift either the whole projection unit or the construction space mutually in parallel.

This process has the significant drawback that relatively high masses have to be moved towards each other very precisely in order to ensure an exact abutment and a close connection of the partial planes, which means a considerable expenditure of costs and additional need of space in the whole arrangement for the mechanics required therefore.

With the selective direct illumination by scanning m.H. of a LED- or laser-diode-line/-matrix or direct illumination by a mask, which is formed by a transmissive LCD, the resolution in the construction plane is equivalent to the resolution in the image forming unit.

OBJECT OF THE INVENTION

It is an object of the invention to provide a process or a device which can enhance the resolution in the construction plane, while maintaining the same large construction area, many times in the sub-pixel range, i.e. to refine the rastering of the outer and inner contours in the sectional planes of the object, a) without having to carry out an illumination in partial areas to be composed together, and b) without enhancing the resolution of the rastered image-forming unit itself.

SOLUTION OF THE OBJECT

The present invention provides a process for the production of a three-dimensional object by layer-wise solidification of a material solidifiable by the action of electromagnetic irradiation by means of mask illumination, wherein the mask is produced by an image forming unit having a prescribed resolution, which mask is formed from a constant number of image forming elements (pixel) being discrete and spatially arranged in a fixed manner to each other, characterized in that, for improving the resolution in the sub-pixel range along the outer and inner contours of the sectional areas of the object to be generated layer-wise, a multiple illumination is carried out for each layer which consists of a sequence of a multitude of images mutually shifted in the sub-pixel range in the image/construction plane, wherein a separate mask/bitmap is produced for each shifted image.

The invention also provides a device for the production of a three-dimensional object by layer-wise solidification of a material which is solidifiable under the application of electromagnetic irradiation by means of mask illumination, whereby the irradiation necessary for hardening is imaged into the image/construction plane, wherein the device comprises a rastered, image forming unit for the selective illumination, which is embodied either by line or by matrix, characterized in that the image forming unit composes the image from individual image dots (pixels) and thus forms a rastered mask (bitmap), wherein the pixels are arranged within the plane in a manner mutually fixed to each other, and that the image forming unit and/or an imaging optic which is provided between the image forming unit and the image/construction plane is/are designed such that a sequence of a multitude of images, which are mutually shifted in a sub-pixel range, can be created, wherein a separate mask/bitmap can be produced for each shifted image.

Preferred embodiments of the process of the present invention include one or more of the following features:

(a) said image forming unit is formed of a constant number of image forming elements (pixel) being discrete and spatially arranged to each other in a two-dimensional matrix;

(b) a sequence of at least 2 images mutually shifted in the sub-pixel range is carried out in the image/construction plane, corresponding to the resolution of the image forming unit and under consideration of the corresponding sub-pixel shift;

(c) the sectional area, i.e. outer and inner contours, are defined by vectorial trails which are superimposed by technical image processing by a rastered area (bitmap), the resolution of which exactly corresponds to the resolution of the discrete elements (pixels) in the image forming unit and thus in the image in the construction plane, wherein the superimposition of vectorial trails and bitmap takes place in a superior-ordered XY-coordinate system, and wherein the active pixels are calculated by a specific algorithm in order to define the sectional area in the form of a rastered mask;

(d) the mask generation (bitmapping) of each sectional area of a three-dimensional object is carried out in the starting position and in various states displaced (shifted) in the sub-pixel range in XY, and that a total image having an enhanced resolution in the contour portion corresponding to the pixel shift is obtained by the superimposition of these bitmaps per sectional area;

(e) a bitmap is produced which is shifted relative to the sectional area by delta X, which results in a new distribution of active pixels;

(f) a bitmap is produced which is shifted by delta Y in the sub-pixel range relatively to the sectional area, which results in a new distribution of active pixels;

(g) a bitmap is produced which is shifted along the pixel diagonal by delta X and delta Y relatively to the sectional area, which results in a new distribution of active pixels;

(h) the total illumination of an individual layer results from the sum of the partial illuminations of the masks/bitmaps shifted in the sub-pixel range;

(i) for each layer of the object, a multitude of masks or bitmaps having different sub-pixel shifts in XY can be generated and can be illuminated serially for each layer to be hardened;

(j) a simplified process for resolution improvement is achieved in such a manner that only the bitmap of the starting position and the bitmap of the diagonal-shift by a half pixel-diagonal are produced and are subsequently illuminated for each layer to be hardened;

(k) for the shifted imaging of the rastered masks/bitmaps in the construction plane which are produced in a shifted manner in the sub-pixel range for the purpose of selectively hardening the material layer, the image forming unit is tilted for each shifted bitmap such that the desired shift of the image in the sub-pixel range in the image/construction plane is achieved;

(l) for the shifted imaging of the rastered masks/bitmaps in the construction plane which are produced in a shifted manner in the sub-pixel range for the purpose of selectively hardening the material layer, the image forming unit for each shifted bitmap is shifted by the corresponding sub-pixel range in X and Y, that is parallel in plane to the image/construction plane;

(m) for the shifted imaging of the rastered masks/bitmaps in the construction plane which are produced in a shifted manner in the sub-pixel range for the purpose of selectively hardening the material layer, the image forming projection unit is maintained fixed in its position, and the imaging optic of the projection unit is tilted for each shifted bitmap such that the desired shift of the image in the image/construction plane in the sub-pixel range is achieved;

(n) for the shifted imaging of the rastered masks/bitmaps in the construction plane which are produced in a shifted mariner in the sub-pixel range for the purpose of selectively hardening the material layer, the image forming projection unit is maintained fixed in its position, and the imaging optic of the projection unit is shifted for each shifted bitmap in XY such that the desired shift of the image in the image/construction plane in the sub-pixel range is achieved;

(o) for the shifted imaging of the rastered masks/bitmaps in the construction plane which are produced in a shifted manner in the sub-pixel range for the purpose of selectively hardening the material layer, the projection unit is tilted for each bitmap via actuators such that the projected image in the construction plane is shifted in the corresponding sub-pixel range in X and Y;

(p) for the shifted imaging of the rastered masks/bitmaps in the construction plane which are produced in a shifted manner in the sub-pixel range for the purpose of selectively hardening of the material layer, a cardanic mounted transparent, plane-parallel plate is arranged between the projection unit and the image/construction plane, which plate shifts, by rotation around two axis (XY) which are present in-plane parallel to the image/construction plane, the projection beam path and thus the image in the image/construction plane in the sub-pixel range in X and Y;

(q) for the shifted imaging of the rastered masks/bitmaps in the construction plane which are produced in a shifted mariner in the sub-pixel range for the purpose of selectively hardening of the material layer, a transparent plane-parallel plate is arranged between the projection unit and the image/construction plane, which plate shifts, by rotation around an axis parallel to a pixel-diagonal, the projection beam path and thus the image in the image/construction plane in the sub-pixel range along the pixel diagonal which is orthogonal thereto;

(r) for the shifted imaging of the rastered masks/bitmaps in the construction plane which are produced in a shifted manner in the sub-pixel range for the purpose of selectively hardening of the material layer, the projection unit is maintained fixed in its position, and the projection beam is deflected via a mirror into the image/construction plane, wherein the deflecting mirror is provided with an adjustment possibility (cardanic support) by which the projection beam for each shifted bitmap can be deflected such that a shift of the image in the sub-pixel range is achieved in the image-/construction plane; and (s) the projected light output for each pixel is varied by "grey scaling" within a projection mask, in order to selectively influence the hardening level in a layer thereby and thus to raise the light output of the contour-pixel relative to the light output of the area-pixel, in order to compensate the partial illumination due to partial superimposition of a contour-pixel by the sub-pixel shift of the individual bitmap in the contour portion.

Preferred embodiments of the device of the present invention include one or more of the following features:

(1) said image forming unit for the selective illumination is embodied by a matrix;

(2) a series of at least 2 images, which are mutually shifted in a sub-pixel range, can be created in the image/construction plane (3) said image forming unit is a projection unit;

(4) said image forming unit is a line, particularly a matrix having discretely emitting elements for image formation;

(5) the device is provided with actuators in order to shift the whole image forming unit per partial image in a plane-parallel manner towards the image/construction plane in XY in the sub-pixel range;

(6) the device is provided with actuators which can tilt the image forming unit per shift-generated bitmap such that the individual, shift-generated bitmaps in the image/construction plane are imaged in a manner shifted in the sub-pixel range;

(7) between the image forming unit and the image/construction plane, a mirror is arranged as an imaging optic and is cardanically mounted and is rotatable via actuators such that the beam path is deflected into the image plane and that the individual, shift-generated bitmaps in the image-/construction plane can be imaged in a correspondingly shifted manner in the sub-pixel range;

(8) between the image forming unit and the image/construction plane, a transparent plate having mutual plane-parallel surfaces is arranged as an imaging optic and can be tilted by means of one or more actuators such that the beam path is shifted and that the individual, shift-generated bitmaps in the image-/construction plane are imaged in a manner shifted in the sub-pixel range;

(9) the image forming projection unit is maintained fixed in its position and that the imaging optic can be shifted in XY in a sub-pixel range of the image forming unit via actuators such that the desired shift of the image in the image-/construction plane in a sub-pixel range is achieved; and

(10) the image forming projection unit is maintained fixed in its position and that the imaging optic can be tilted via actuators such that the desired shift of the image in the image/construction plane in the sub-pixel range is achieved.

DESCRIPTION OF THE INVENTION AND ITS ADVANTAGES

By means of the process of the invention or the device of the invention, the resolution in the image/construction plane is improved in the sub-pixel range by means of "pixel-shift".

In particular, the present invention deals with the layer-wise solidification for the production of three-dimensional objects or construction elements by means of solidification of material (specifically by means of photo-polymerization) through mask projection, but not with a conventional layer-wise solidification through (linear) scan technique. This can be carried out according to the invention very efficiently and advantageously by using a two-dimensionally set array as the image generating element, wherein raster and/or resolution is(are) preset, e.g. by means of a set micro mirror array.

Compared to the scan technique, which is called VAROS (Variable Refraction Optical System) by Canon and "Double-CCD" by Epson, the principle of reading and overlapping of images mutually shifted in the sub-pixel range is used in this invention for rastered image forming processes of rapid prototyping.

The resolution or the number of image dots of the rastered, image forming unit itself does not have to be increased in order to realize an improvement in the solution within the construction plane.

For the enhancement of the resolution, the illumination does not occur in correspondingly down-sized, adjacently disposed partial areas, whereby the construction/illumination period for the whole area would be increased by the number of partial areas; rather, the projection/illumination occurs over the whole construction area.

By the measure that an overlapping of images that are mutually shifted in the sub-pixel range takes place, the construction/illumination period of the whole area increases only insubstantially.

The level of resolution improvement within the construction plane can be chosen freely.

DESCRIPTION OF THE DRAWINGS AND THE PREFERRED EMBODIMENTS OF THE INVENTION

The present invention will be explained in detail in the following by way of examples and not in a limiting manner by means of drawings.

FIG. 1 schematically shows a basic device for the generation of a three-dimensional object 3 by layer-wise hardening of a photohardening material 4 by means of mask projection 8, wherein the projection unit 1 is present, with an image forming optic 2, above the basin 6 which is filled with photohardening material 4, and wherein the object 3 solidifies layer-wise on a support plate 5, which can be moved within the basin 6 in vertical direction. In a process based on photohardening by means of mask illumination, the irradiation necessary for hardening is projected into the image/construction plane 7. The illumination is carried out by means of a rastered image forming unit, which is formed in the form of a matrix. The image thus is composed of single image dots (pixels) and thus forms a rastered mask (bitmap), wherein the pixels are arranged in a specially fixed manner to each other within the plane.

By a simple example, FIG. 8-12 show the principle of a mask generation (bitmapping) of a sectional area of a three-dimensional object in the starting position (FIG. 8) and in various states of the bitmap which are displaced (shifted) in the sub-pixel range (FIG. 9-11), as well as the overlapping of all bitmaps (FIG. 12).

The sectional area, i.e. the outer and inner contours, are prescribed by a sectorial trail 11, which is superimposed by a rastered area (bitmap) 12, the solution of which exactly corresponds to the resolution of the discrete elements (pixels) within the projected image 8 which is formed by the image forming matrix. Vectorial trail 11 and bitmap 12 thus exist within a superior-ordered XY-coordinate system 10. FIG. 8 shows the bitmap in its starting position. By means of a specific algorithm, the active pixels 13 which describe the sectional area within the bitmap 12 in its starting position are calculated.

In FIG. 9, the bitmap 14 is shifted within the sub-pixel range relative to the sectional area by delta X, whereby a new distribution of active pixels 15 is produced.

Figure 12:
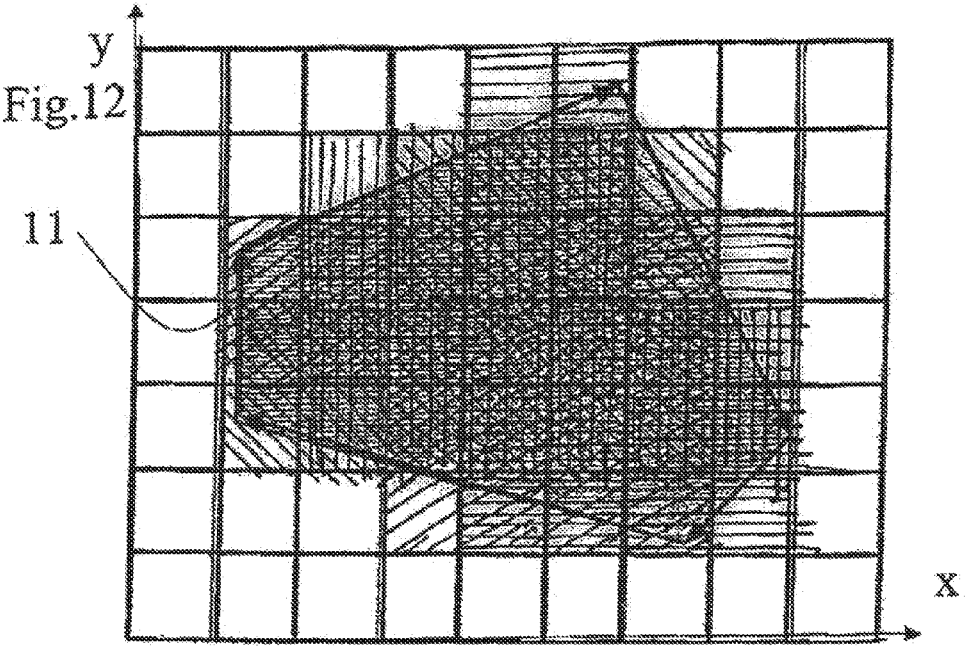

In FIG. 12, all bitmaps 12, 14, 16 and 18 with their active pixels 13, 15, 17 and 19 are shown superimposed, whereby a resolution improvement in the (outer) contour portion of the sectional area is clearly noticeable.

Figure 8:
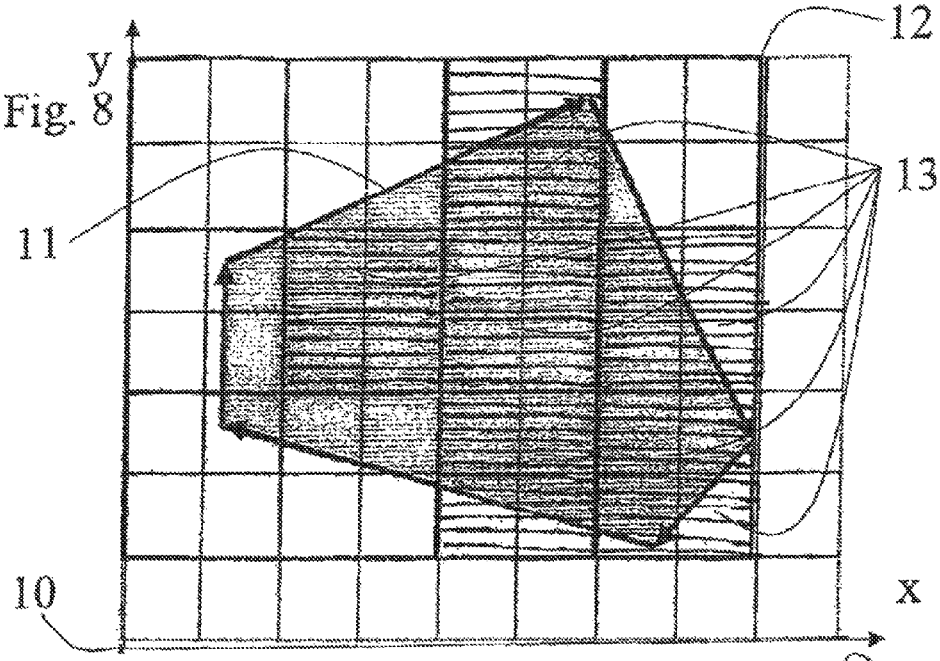
Figure 9:
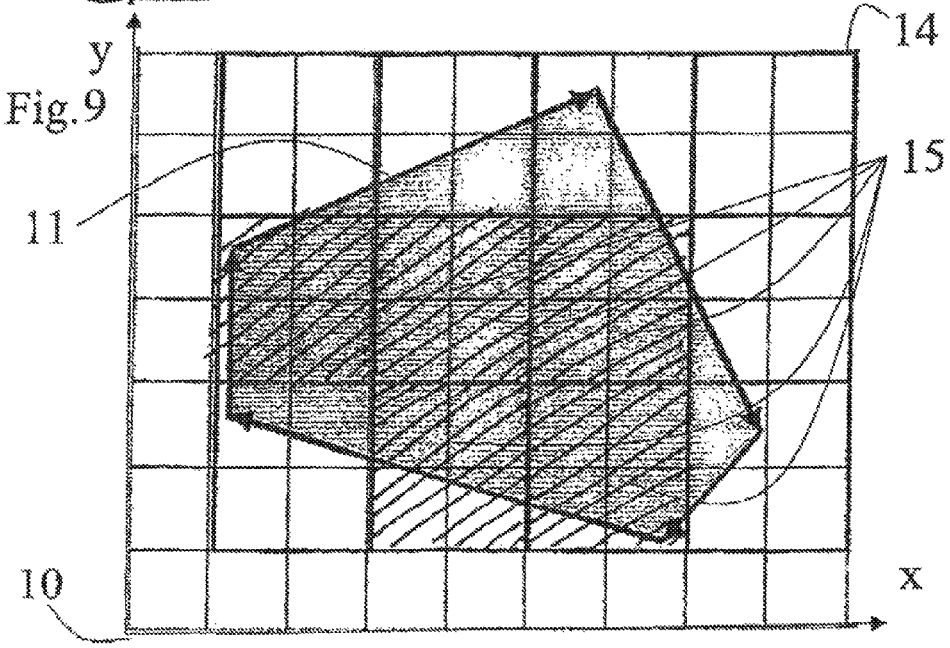
Figure 10:
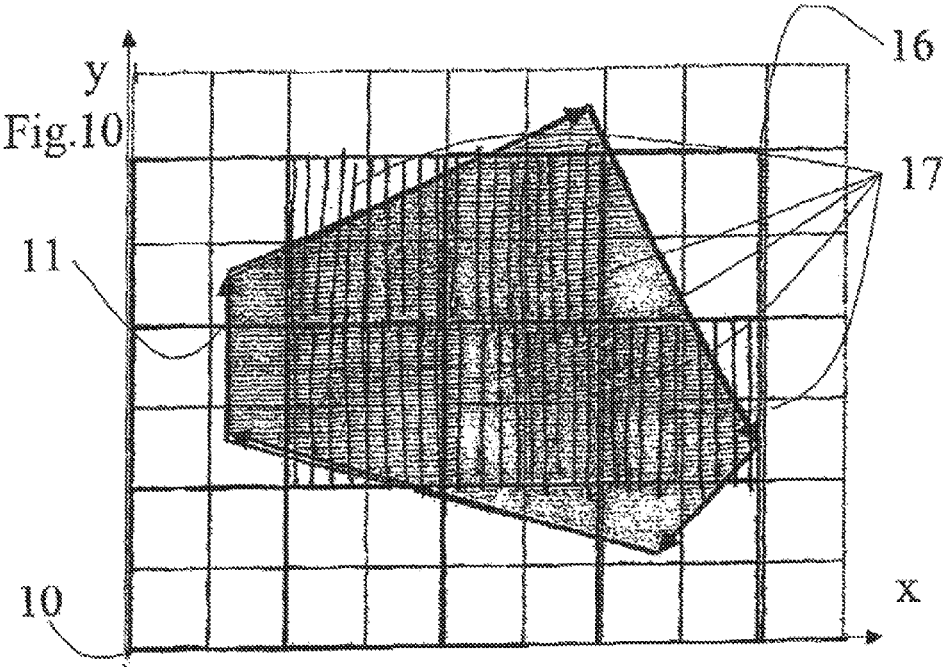
FIG. 10 shows a shift of bitmap 16 relative to the sectional area by delta Y with active pixels 17.
Figure 11:
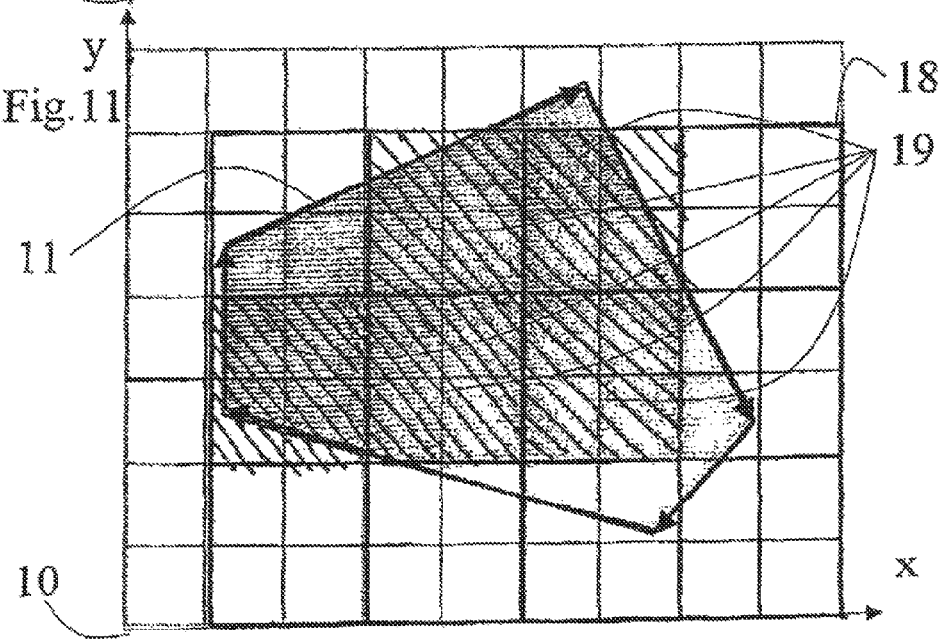
FIG. 11 shows a diagonal shift of bitmap 18 relative to the sectional area by delta X and delta Y with active pixels 19.

A simplified process for resolution improvement is achieved by the measure that only bitmap 12 of the started position (FIG. 8) and bitmap 18 of the diagonal shift (FIG. 11) are superimposed. In this case, the bitmap or the image does only have to be shifted in one direction along the diagonal of the pixels.

Depending on the resolution improvement desired for each object layer, a multiple (at least twice) of masks or bitmaps having different sub-pixel shifts can be generated and superimposed.

Figure 1:
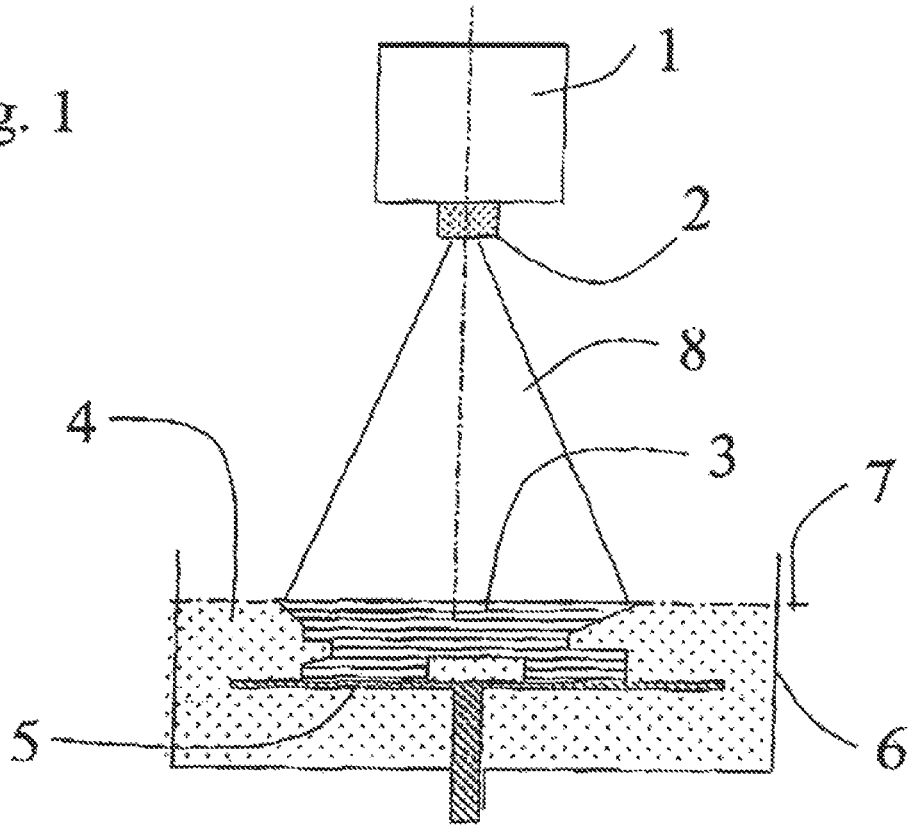
Figure 2:
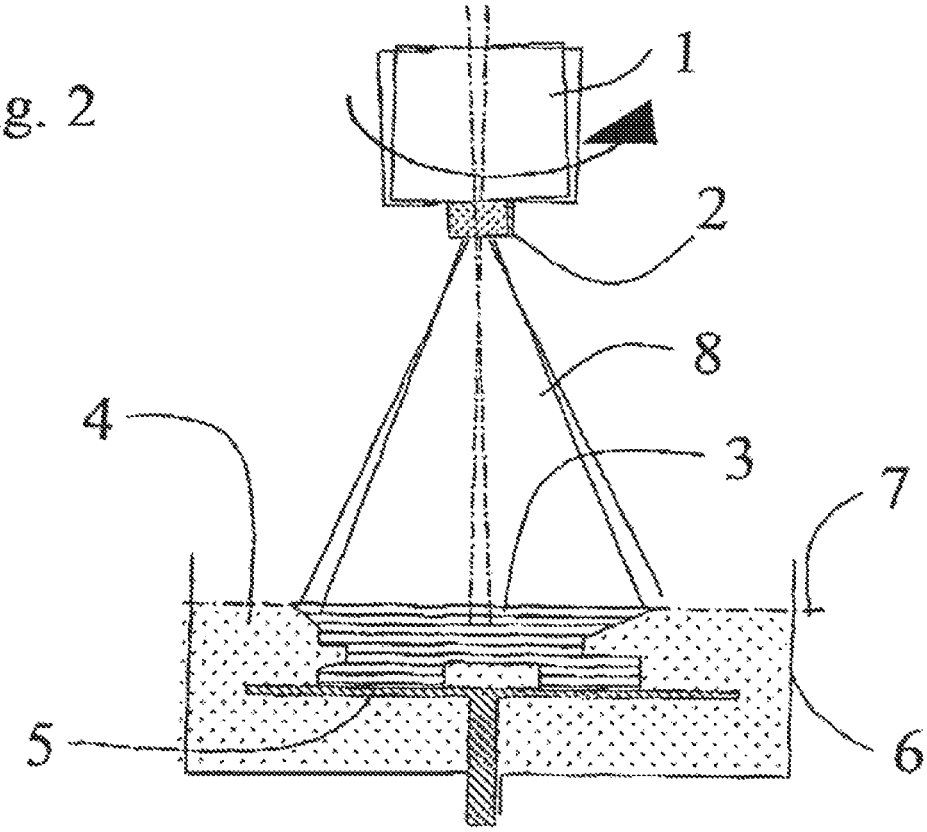
Figure 3:
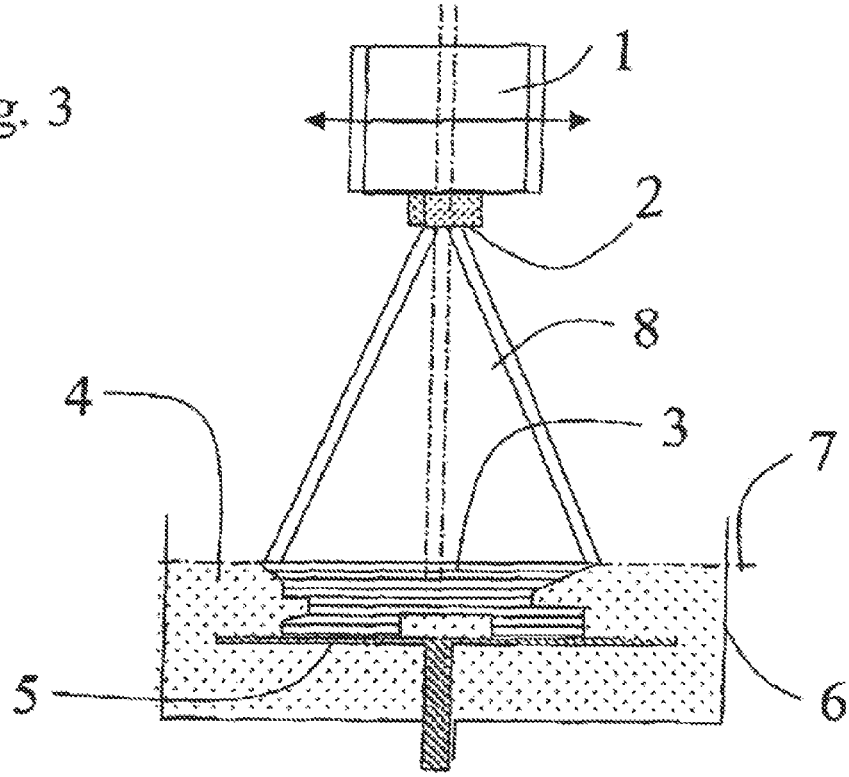
Figure 4:
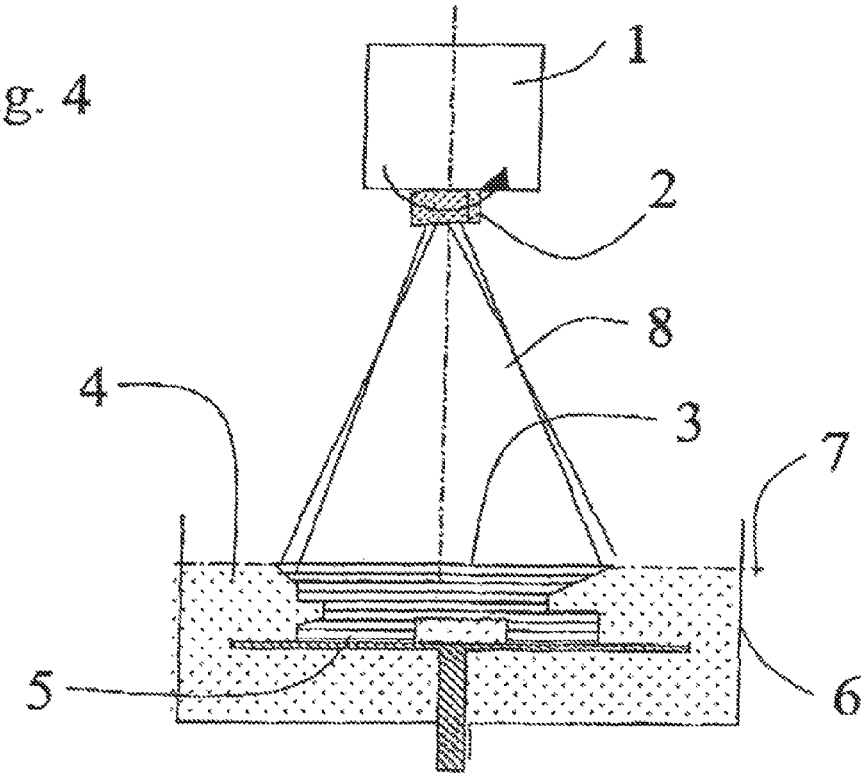
Figure 5:
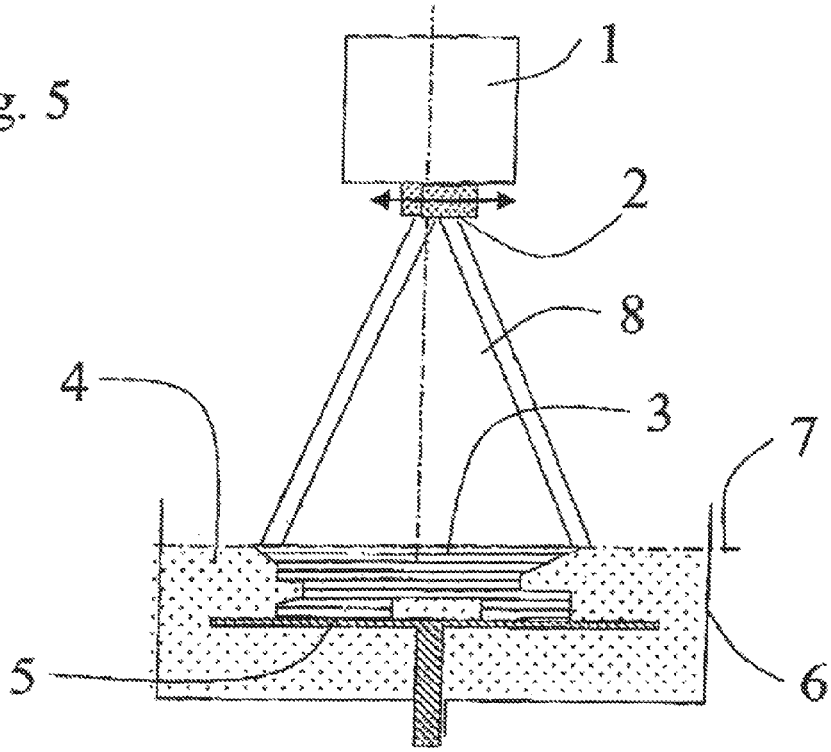
Figure 6:
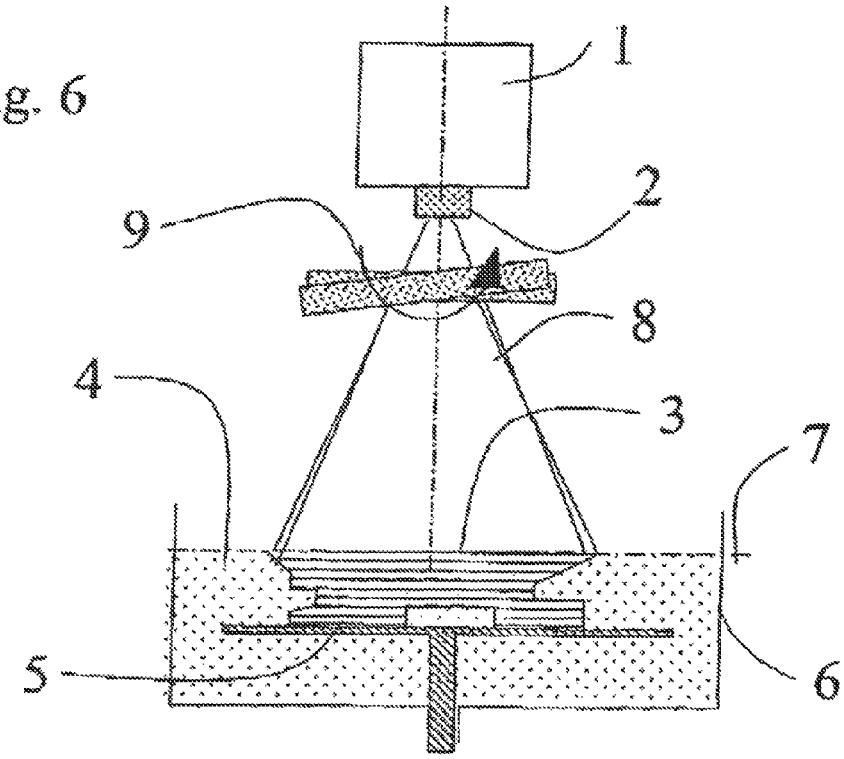
Figure 7:
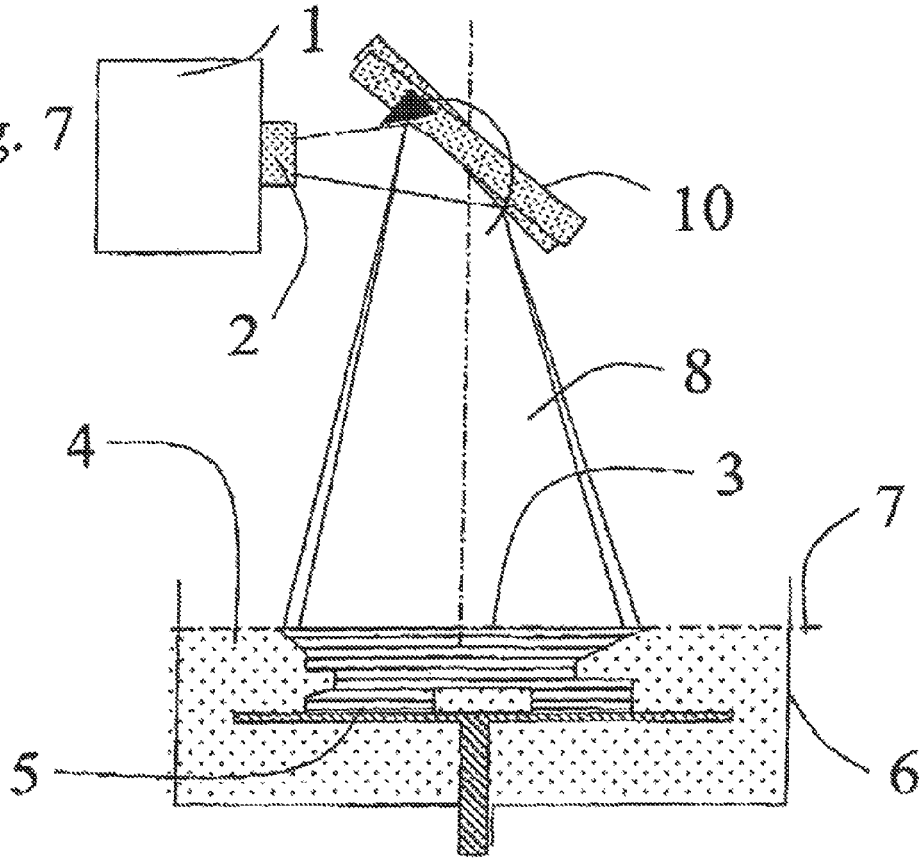

By means of a differently shifted and superimposed illumination of each object/material layer (here by means of bitmaps 12, 14, 16, 18), a resolution improvement in XY in the portion of outer and inner contours is achieved. In order to realize respective sub-pixel shifts in the image within the construction plane, the following various embodiments are described:

1) In FIG. 2, the image forming unit 1 is tilted for each shifted bitmap such that the desired shift of the image in the sub-pixel range within the image/construction plane is achieved.
2) In FIG. 3, the image forming unit 1 is shifted for each shifted bitmap by the corresponding sub-pixel level in X and 7, that is parallel in plane to the image/construction plane, by means of actuators.
3) In FIG. 4, the image forming projection unit is maintained fixed in its position, The imaging optic 2 is tilted for each shifted bitmap such that the desired shift of the image within the image-/construction plane in the sub-pixel range is achieved.
4) In FIG. 5, the image forming projection unit is maintained fixed in its position. The imaging optic 2 is moved for each shifted bitmap in XY such that the desired shift of the image within the image-/construction plane in the sub-pixel range is achieved.
5) Particular cases for imaging by image-ward telecentric irradiation path, by an image-ward approximately telecentric irradiation path, and by teleobjectives having long focal length, in order to keep optical errors (angle errors, distortion) small:
   a) In FIG. 5, the projection unit 1 is tilted for each shifted bitmap via actuators such that the projection image 8 within the image/construction plane 7 is shifted in the corresponding sub-pixel range in X and Y.
   b) In FIG. 6, a cardanically mounted transparent, plane-parallel plate 9 (glass plate) is disposed between the protection unit 1 and the image/construction plane 7, which plate shifts the protection irradiation path 8 and thus the image within the image/construction plane 7 in the sub-pixel range in X and 7 by means of rotation around two axis (XY), which are located parallel in plane to the image/construction plane.
   c) In FIG. 7, the projection unit 1 is maintained fixed in its position. The projection beam 8 is deflected via a mirror 10 into the image/construction plane 7. The deflecting mirror 10 is provided with an adjustment possibility (cardanic support), by which the protection beam can be deflected for each shifted bitmap such that a shift of the image within the image/construction plane 7 in the sub-pixel range is achieved.

The embodiments 1) to 5) or a) to c) described above can be realized individually or combined with each other.

The bitmaps of each individual layer necessary for mask projection are generated from layer data, in which the outer and inner contours of the respective object section is represented in vectorial trails (as e.g. defined in the data format CLI).

For this, a specific SW is used which carries out the transformation of the vectorial trails into the bitmap format (bitmapping).

For each sub-pixel shift in XY, a separate bitmap is generated by transforming the XY coordinates of the vectors (for the outer and the inner contours) of the layer data by the respective shift-offset in XY (in the sub-pixel range), and by superposing them over the bitmap-raster, and thus by calculating a new distribution of active pixels for each shift.

The projected light output per pixel can be varied by "grey scaling" within a projection mask, in order to selectively influence the hardening level in one layer thereby. This is particularly meaningful in order to raise the light output of the pixels of the contour because only partial superimposition of the respective pixels of the contour are produced here due to the sub-pixel shift over individual bitmaps (in the areas within the contours a complete superimposition of the pixels of each individual bitmap is ensured).

When projecting/superimposing the section images shifted by sub-pixels, an almost homogeneous distribution of the light output or the illumination intensity can be achieved by means of the superimposition of grey scalings, particularly along the contours of the projected area structure, through the sum of the grey scaling masks.

The invention claimed is:

1. A process for the production of a three-dimensional object by layer-wise solidification of a material solidifiable by the action of electromagnetic irradiation by means of mask illumination, comprising: providing a projection unit for producing a mask having an image forming optic directed at a solidifiable material; producing a mask, wherein the mask is produced by an image forming unit having a prescribed resolution, which mask is formed from a constant number of image forming elements (pixel) being discrete and spatially arranged in a fixed manner to each other, characterized in that, for improving the resolution in the sub-pixel range along the outer and inner contours of the sectional areas of the object to be generated layer-wise, a multiple illumination is carried out for each layer which consists of a sequence of a multitude of images mutually shifted in the sub-pixel range in the image/construction plane, wherein a separate mask/bitmap is produced for each shifted image.

2. The process according to claim 1, characterized in that said image forming unit is formed of a constant number of image forming elements (pixel) being discrete and spatially arranged to each other in a two-dimensional matrix.

3. The process according to claim 1, characterized in that a sequence of at least 2 images mutually shifted in the sub-pixel range is carried out in the image/construction plane, corresponding to the resolution of the image forming unit and under consideration of the corresponding sub-pixel shift.

4. The process according to claim 1 for the generation of the bitmap from a sectional area of a three-dimensional object, characterized in that the sectional area, i.e. outer and inner contours, are defined by vector paths which are superimposed by technical image processing by a rastered area (bitmap), the resolution of which exactly corresponds to the resolution of the discrete elements (pixels) in the image forming unit and thus in the image in the construction plane, wherein the superimposition of vector paths and bitmap takes place in a superior-ordered XY-coordinate system, and wherein the active pixels are calculated by a specific algorithm in order to define the sectional area in the form of a rastered mask.

5. The process according to claim 1, characterized in that the mask generation (bitmapping) of each sectional area of a three-dimensional object is carried out in the starting position and in various states displaced (shifted) in the sub-pixel range in XY, and that a total image having an enhanced resolution in the contour portion corresponding to the pixel shift is obtained by the superimposition of these bitmaps per sectional area.

6. The process according to claim 1, characterized in that a bitmap is produced which is shifted relative to the sectional area by delta X, which results in a new distribution of active pixels.

7. The process according to claim 1, characterized in that a bitmap is produced which is shifted by delta Y in the sub-pixel range relatively to the sectional area, which results in a new distribution of active pixels.

8. The process according to claim 1, characterized in that a bitmap is produced which is shifted along the pixel diagonal by delta X and delta Y relatively to the sectional area, which results in a new distribution of active pixels.

9. The process according to claim 1, characterized in that the total illumination of an individual layer results from the sum of the partial illuminations of the masks/bitmaps shifted in the sub-pixel range.

10. The process according to claim 1, wherein, for each layer of the object, a multitude of masks or bitmaps having different sub-pixel shifts in XY can be generated and can be illuminated serially for each layer to be hardened.

11. The process according to claim 1, characterized in that a simplified process for resolution improvement is achieved in such a manner that only the bitmap of the starting position and the bitmap of the diagonal-shift by a half pixel-diagonal are produced and are subsequently illuminated for each layer to be hardened.

12. The process according to claim 1, characterized in that, for the shifted imaging of the rastered masks/bitmaps in the construction plane which are produced in a shifted manner in the sub-pixel range for the purpose of selectively hardening the material layer, the image forming unit is tilted for each shifted bitmap such that the desired shift of the image in the sub-pixel range in the image/construction plane is achieved.

13. The process according to claim 1, characterized in that, for the shifted imaging of the rastered masks/bitmaps in the construction plane which are produced in a shifted manner in the sub-pixel range for the purpose of selectively hardening the material layer, the image forming unit for each shifted bitmap is shifted by the corresponding sub-pixel range in X and Y, that is parallel in plane to the image/construction plane.

14. The process according to claim 1, characterized in that, for the shifted imaging of the rastered masks/bitmaps in the construction plane which are produced in a shifted manner in the sub-pixel range for the purpose of selectively hardening the material layer, the image forming projection unit is maintained fixed in its position, and the imaging optic of the projection unit is tilted for each shifted bitmap such that the desired shift of the image in the image/construction plane in the sub-pixel range is achieved.

15. The process according to claim 1, characterized in that, for the shifted imaging of the rastered masks/bitmaps in the construction plane which are produced in a shifted manner in the sub-pixel range for the purpose of selectively hardening the material layer, the image forming projection unit is maintained fixed in its position, and the imaging optic of the projection unit is shifted for each shifted bitmap in XY such that the desired shift of the image in the image/construction plane in the sub-pixel range is achieved.

16. The process according to claim 1, characterized in that, for the shifted imaging of the rastered masks/bitmaps in the construction plane which are produced in a shifted manner in the sub-pixel range for the purpose of selectively hardening the material layer, the projection unit is tilted for each bitmap via actuators such that the projected image in the construction plane is shifted in the corresponding sub-pixel range in X and Y.

17. The process according to claim 1, characterized in that, for the shifted imaging of the rastered masks/bitmaps in the construction plane which are produced in a shifted manner in the sub-pixel range for the purpose of selectively hardening of the material layer, a cardanic mounted transparent, plane-parallel plate is arranged between the projection unit and the image/construction plane, which plate shifts, by rotation around two axis (XY) which are present in-plane parallel to the image/construction plane, the projection beam path and thus the image in the image/construction plane in the sub-pixel range in X and Y.

18. The process according to claim 1, characterized in that, for the shifted imaging of the rastered masks/bitmaps in the construction plane which are produced in a shifted manner in the sub-pixel range for the purpose of selectively hardening of the material layer, a transparent plane-parallel plate is arranged between the projection unit and the image/construction plane, which plate shifts, by rotation around an axis parallel to a pixel-diagonal, the projection beam path and thus the image in the image/construction plane in the sub-pixel range along the pixel diagonal which is orthogonal thereto.

19. The process according to claim 1, characterized in that, for the shifted imaging of the rastered masks/bitmaps in the construction plane which are produced in a shifted manner in the sub-pixel range for the purpose of selectively hardening of the material layer, the projection unit is maintained fixed in its position, and the projection beam is deflected via a mirror into the image/construction plane, wherein the deflecting mirror is provided with an adjustment possibility (cardanic support) by which the projection beam for each shifted bitmap can be deflected such that a shift of the image in the sub-pixel range is achieved in the image-/construction plane.

20. The process according to claim 1, characterized in that the projected light output for each pixel is varied by "grey scaling" within a projection mask, in order to selectively influence the hardening level in a layer thereby and thus to raise the light output of the contour-pixel relative to the light output of the area-pixel, in order to compensate the partial illumination due to partial superimposition of a contour-pixel by the sub-pixel shift of the individual bitmap in the contour portion.

21. The process of claim 1, wherein each image that is mutually shifted in the subpixel range defines a degree of overlap between the object and each pixel and the multiple illumination step comprises projecting the electromagnetic radiation onto the solidifiable material based on each degree of overlap for each pixel and each mutually shifted image.

22. The process of claim 1, wherein each image in the multitude of images corresponds to a different bitmap location relative to a fixed coordinate system.

23. The process of claim 1, wherein the image forming unit includes an image forming matrix, and the multiple illumination of each object layer comprises:

providing an image of the object layer;

defining a bitmap, wherein the bitmap has a plurality of grid elements and each grid element corresponds to a location in the image forming unit;

superimposing the layer image on the bitmap to define a first relative orientation between the layer image and the bitmap;

calculating a first degree of overlap between each grid element and the layer image when the bitmap is in the first relative orientation;

shifting the bitmap relative to the layer image to define a second relative orientation between the layer image and the bitmap;

calculating a second degree of overlap between each grid element and the layer image when the layer image is in the second relative orientation; and projecting electromagnetic radiation onto the curable resin based on the first degree of overlap and the second degree of overlap for each grid element.

24. The process of claim 23, wherein the step of projecting electromagnetic radiation onto the curable resin comprises first projecting electromagnetic radiation onto the curable resin such that each location in the image forming unit matrix projects electromagnetic radiation having an intensity that corresponds to the first degree of overlap for the bitmap grid element that corresponds to the image forming unit matrix location and second projecting electromagnetic radiation onto the curable resin such that each location in the image forming unit matrix projects electromagnetic radiation having an intensity that corresponds to the second degree of overlap for the bitmap grid element that corresponds to the image forming unit matrix location.

* * * * *

UNITED STATES PATENT AND TRADEMARK OFFICE

CERTIFICATE OF CORRECTION

PATENT NO. : RE43,955 E
APPLICATION NO. : 13/230270
DATED : February 5, 2013
INVENTOR(S) : Shkolnik It is certified that error appears in the above-identified patent and that said Letters Patent is hereby corrected as shown below:

Please delete the title page and insert the new title page with deleting "El-Sibiani" and inserting --El-Siblani-- as shown on the attached page Signed and Sealed this
Twenty-sixth Day of February, 2013

Teresa Stanek Rea
*Acting Director of the United States Patent and Trademark Office*

(19) United States
(12) Reissued Patent
Shkolnik et al.

(10) Patent Number: US RE43,955 E
(45) Date of Reissued Patent: Feb. 5, 2013

(54) PROCESS FOR THE PRODUCTION OF A THREE-DIMENSIONAL OBJECT WITH RESOLUTION IMPROVEMENT BY PIXEL-SHIFT

(75) Inventors: Alexandr Shkolnik, Los Angeles, CA (US); Hendrik John, Hunxe (DE); Ali El-Siblani, Dearborn Heights, MI (US)

(73) Assignee: Envisiontec GmbH, Gladbeck (DE)

(21) Appl. No.: 13/230,270

(22) Filed: Sep. 12, 2011

Related U.S. Patent Documents

Reissue of:
(64) Patent No.: 7,790,093
Issued: Sep. 7, 2010
Appl. No.: 11/126,068
Filed: May 9, 2005

U.S. Applications:
(60) Provisional application No. 60/569,893, filed on May 10, 2004.

(30) Foreign Application Priority Data

May 10, 2004 (DE) ..... 10 2004 022 961

(51) Int. Cl.
*G02F 1/00* (2006.01)
(52) U.S. Cl. ..... 264/401; 700/120; 264/497
(58) Field of Classification Search ..... 264/401, 264/497; 700/120
See application file for complete search history.

(56) References Cited

U.S. PATENT DOCUMENTS

| | | | |
|---|---|---|---|
| 4,575,330 | A | 3/1986 | Hull |
| 4,837,379 | A | 6/1989 | Weinberg |
| 4,929,402 | A | 5/1990 | Hull |
| 4,999,143 | A | 3/1991 | Hull et al. |
| 5,093,130 | A | 3/1992 | Fujii et al. |
| 5,137,662 | A | 8/1992 | Hull et al. |
| 5,143,663 | A | 9/1992 | Leyden et al. |
| 5,173,266 | A | 12/1992 | Kenney |
| 5,174,931 | A | 12/1992 | Almquist et al. |
| 5,236,637 | A | 8/1993 | Hull |

(Continued)

FOREIGN PATENT DOCUMENTS

| | | | |
|---|---|---|---|
| DE | 4105314 | A1 | 8/1991 |
| DE | 4102257 | A1 | 7/1992 |

(Continued)

OTHER PUBLICATIONS

Opposition to EP 1,849,587, dated Apr. 8, 2016

(Continued)

*Primary Examiner* Joseph Del Sole
*Assistant Examiner* Kimberly A Stewart
(74) *Attorney, Agent, or Firm* Hansen IP Law PLLC

(57) ABSTRACT

The invention relates to a process or a device for the production of a three-dimensional object by layer-wise solidification of a material which is solidifiable under the application of electromagnetic irradiation by means of mask illumination, wherein the mask is produced using an image forming unit having a prescribed resolution, which is formed from a constant number of image forming elements (pixels) being discrete and being arranged in a spatially mutually fixed manner. For the improvement of the resolution along the outer and inner contours of the sectional areas of the object to be generated layer-wise in the sub-pixel range, a multiple illumination per layer is performed, which consists of a series of multiple images that are mutually shifted in the sub-pixel range in the image/construction plane, wherein a separate mask/bitmap is produced for each shifted image.

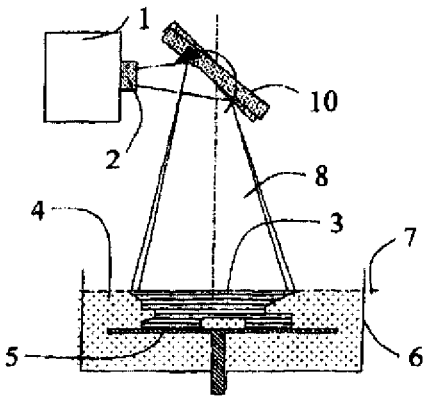

24 Claims, 7 Drawing Sheets